United States Patent
Carey et al.

(10) Patent No.: US 7,433,162 B2
(45) Date of Patent: *Oct. 7, 2008

(54) MAGNETORESISTIVE SENSOR WITH ANTIFERROMAGNETIC EXCHANGE-COUPLED STRUCTURE FORMED BY USE OF CHEMICAL-ORDERING ENHANCEMENT LAYER

(75) Inventors: Matthew J. Carey, San Jose, CA (US); Brian R. York, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 431 days.

This patent is subject to a terminal disclaimer.

(21) Appl. No.: 11/356,891

(22) Filed: Feb. 16, 2006

(65) Prior Publication Data

US 2006/0139816 A1    Jun. 29, 2006

Related U.S. Application Data

(63) Continuation-in-part of application No. 10/791,927, filed on Mar. 2, 2004, now Pat. No. 7,339,769.

(51) Int. Cl.
*G11B 5/39* (2006.01)
(52) U.S. Cl. .................................. 360/324.11
(58) Field of Classification Search ............. 360/324.1, 360/324.11, 324.12, 324.2
See application file for complete search history.

(56) References Cited

U.S. PATENT DOCUMENTS

| 5,315,468 | A | | 5/1994 | Lin et al. |
| 5,465,185 | A | | 11/1995 | Heim et al. |
| 5,910,863 | A | * | 6/1999 | Miyazaki et al. ......... 360/235.1 |
| 6,313,973 | B1 | * | 11/2001 | Fuke et al. ............... 360/324.1 |
| 6,387,548 | B1 | * | 5/2002 | Hasegawa et al. ......... 428/811.2 |
| 6,943,041 | B2 | * | 9/2005 | Sugita et al. .................. 438/3 |
| 7,339,769 | B2 | * | 3/2008 | Carey et al. ............ 360/324.11 |
| 2004/0235202 | A1 | * | 11/2004 | Sugita et al. .................. 438/3 |
| 2007/0086121 | A1 | * | 4/2007 | Nagase et al. ............ 360/324.1 |

OTHER PUBLICATIONS

A. Tanaka et al., "Spin-valve heads in the current-perpendicular-to-plane mode for ultrahigh-density recording", IEEE Transactions on Magnetics, 38 (1): 84-88 Part 1 Jan. 2002.

* cited by examiner

*Primary Examiner*—Jefferson Evans
(74) *Attorney, Agent, or Firm*—Thomas R. Berthold

(57) ABSTRACT

An antiferromagnetically exchange-coupled structure for use in a magnetic device, such as a magnetoresistive sensor, includes an enhancement layer formed of a chemically-ordered tetragonal-crystalline alloy, a chemically-ordered tetragonal-crystalline Mn-alloy antiferromagnetic layer in contact with the enhancement layer, and a ferromagnetic layer exchange-coupled with the antiferromagnetic layer. The enhancement layer is an alloy selected from the group consisting of alloys of AuCu, FePt, FePd, AgTi3, Pt Zn, PdZn, IrV, CoPt and PdCd, and the antiferromagnetic layer is an alloy of Mn with Pt, Ni, Ir, Pd or Rh. The enhancement layer enhances the transformation of the Mn alloy from the chemically-disordered phase to the chemically-ordered phase.

20 Claims, 2 Drawing Sheets

MAGNETORESISTIVE SENSOR WITH ANTIFERROMAGNETIC EXCHANGE-COUPLED STRUCTURE FORMED BY USE OF CHEMICAL-ORDERING ENHANCEMENT LAYER

RELATED APPLICATION

This application is a continuation-in-part of application Ser. No. 10/791,927 filed Mar. 2, 2004 and titled "MAGNETORESISTIVE SENSOR WITH ANTIFERROMAGNETIC EXCHANGE-COUPLED STRUCTURE HAVING UNDERLAYER FOR ENHANCING CHEMICAL-ORDERING IN THE ANTIFERROMAGNETIC LAYER", now U.S. Pat. No. 7,339,769 B2.

TECHNICAL FIELD

The invention relates generally to a ferromagnetic/antiferromagnetic exchange-coupled structure, and more specifically to a magnetoresistive sensor incorporating the structure.

BACKGROUND OF THE INVENTION

The exchange-coupling of a ferromagnetic film to an adjacent antiferromagnetic film with a resulting exchange-bias field in the ferromagnetic film was first reported by W. H. Meiklejohn and C. P. Bean, *Phys. Rev.* 102, 1413 (1959). While the magnetic hysteresis loop of a single ferromagnetic film is centered about zero magnetic field, a ferromagnetic/antiferromagnetic bilayer will show an asymmetric magnetic hysteresis loop that is shifted from zero magnetic field in the plane of the film by an exchange-bias field, $H_B$. In many cases, the direction of the exchange-bias field within the plane of the film can be set during the growth of the antiferromagnetic film and is determined by the orientation of the magnetic moment of the ferromagnetic film when the antiferromagnetic film is deposited on top of the ferromagnetic film. The direction of the exchange bias field can also be changed by heating the ferromagnetic/antiferromagnetic bilayer above the so-called blocking temperature, $T_B$, of the antiferromagnetic film. For other cases, the antiferromagnetic film is chemically ordered, and the direction of the exchange bias field is determined by the direction of the magnetic field when an annealing step orders the antiferromagnet. The detailed mechanism that determines the magnitude of the exchange-bias field is believed to arise from an interfacial interaction between the ferromagnetic and antiferromagnetic films.

Exchange-coupled structures have found several important applications, especially in magnetoresistive sensors used as read heads in magnetic recording hard disk drives.

The most common type of magnetoresistive sensor, called a "spin-valve" (SV) sensor, has a stack of layers that include two ferromagnetic layers separated by a nonmagnetic electrically-conducting spacer layer. One ferromagnetic layer, called the "pinned" layer, has its magnetization direction fixed by being exchange-coupled with an adjacent antiferromagnetic layer. The other ferromagnetic layer has its magnetization direction "free" to rotate in the presence of an external magnetic field, i.e., fields from the recorded data on the magnetic recording disk. With a sense current applied to the sensor, the rotation of the free-layer magnetization relative to the pinned-layer magnetization is detectable as a change in electrical resistance. The conventional SV magnetoresistive sensor operates with the sense current directed parallel to the planes of the ferromagnetic layers, so it is referred to as a current-in-the-plane (CIP) sensor. In a disk drive CIP-SV sensor or read head, the magnetization of the pinned layer is generally perpendicular to the plane of the disk and the magnetization of the free layer is generally parallel to the plane of the disk in the absence of an external magnetic field.

A SV type of magnetoresistive sensor has been proposed that operates with sense current perpendicular to the planes (CPP) of the ferromagnetic layers. CPP-SV sensors are described by A. Tanaka et al., "Spin-valve heads in the current-perpendicular-to-plane mode for ultrahigh-density recording", *IEEE TRANSACTIONS ON MAGNETICS,* 38 (1): 84-88 Part 1 January 2002. Another type of CPP sensor is a magnetic tunnel junction (MTJ) sensor in which the nonmagnetic spacer layer is a very thin nonmagnetic insulating tunnel barrier layer. In a MTJ sensor the tunneling current perpendicularly through the ferromagnetic layers depends on the relative orientation of the magnetizations in the two ferromagnetic layers. While in a CPP-SV magnetoresistive read head the nonmagnetic spacer layer separating the pinned and free ferromagnetic layers is electrically conductive and is typically copper, in a MTJ magnetoresistive read head the spacer layer is electrically insulating and is typically alumina ($Al_2O_3$).

The most common material used for the antiferromagnetic layer to exchange-bias the pinned ferromagnetic layer in magnetoresistive sensors is a chemically-ordered Mn alloy with a tetragonal crystalline structure, such as PtMn, NiMn, IrMn, PdMn and RhMn. These alloys provide relatively high exchange-bias fields, and are described in U.S. Pat. No. 5,315,468. The Mn alloy material is initially chemically-disordered when deposited and provides no exchange-biasing, but becomes chemically-ordered when annealed, as a result of thermally-activated atomic diffusion, and then provides exchange-biasing of the pinned ferromagnetic layer.

The structure of a chemically-ordered Mn alloy with a tetragonal crystalline structure is shown in FIG. 1 for PtMn. The Pt atoms 22 and Mn atoms 24 together form a structure 20 similar to the face-centered-cubic (fcc) structure in which planes 32 of Pt atoms 22 and planes 34 of Mn atoms 24 alternate along the [001] direction. The resulting structure is termed $L1_0$ and corresponds to a super-lattice in the limit that each layer is a single atomic plane thick. An axis 26 perpendicular to atomic planes 32, 34 corresponds to the C-axis of $L1_0$ structure 20, and is parallel to the [001] direction. Axes 28 are parallel to atomic planes 32, 34 and correspond to the A-axes of the $L1_0$ structure 20. In actual devices the degree of ordered tetragonal crystallinity varies with annealing. Complete ordering is not necessary, but sufficient ordering to obtain exchange anisotropy and stability is needed for a robust device.

The use of these Mn alloys, particularly PtMn, as the antiferromagnetic layer in an exchange-coupled structure in a magnetoresistive sensor presents challenges in sensor design and fabrication. These alloys must be made relatively thick and must be annealed at relatively high temperatures. In CPP sensors, the large thickness of the PtMn antiferromagnetic layer is a disadvantage because the high resistivity of PtMn reduces the sensor magnetoresistance (the deltaR/R measurable by the sensor) for a given sense current, or requires that a relatively high sense current be used in the sensor to achieve the desired magnetoresistance. In both CIP-SV CPP sensors, high anneal temperatures may not be compatible with the sensor fabrication process.

What is needed is an exchange-coupled structure that enables the use of Mn-alloys without adversely affecting the design and fabrication of magnetoresistive sensors.

SUMMARY OF THE INVENTION

The invention is an antiferromagnetically exchange-coupled structure for use in a magnetic device, such as a magnetoresistive sensor, that includes an enhancement layer formed of a chemically-ordered tetragonal-crystalline alloy, a chemically-ordered tetragonal-crystalline Mn-alloy antiferromagnetic layer in contact with the enhancement layer, and a ferromagnetic layer exchange-coupled with the antiferromagnetic layer. The enhancement layer is an alloy selected from the group consisting of alloys of AuCu, FePt, FePd, AgTi3, Pt Zn, PdZn, IrV, CoPt and PdCd, and the antiferromagnetic layer is an alloy of Mn with Pt, Ni, Ir, Pd or Rh. The enhancement layer enhances the transformation of the Mn alloy from the chemically-disordered phase to the chemically-ordered phase.

In one example, an exchange-coupled structure with an enhancement layer/antiferromagnetic layer of AuCu/PtMn allows the PtMn to be made substantially thinner, thus reducing the electrical resistance of the structure and improving the performance of a CPP magnetoresistive sensor. The exchange-coupled structure may be located below the spacer layer in a "bottom-pinned" sensor. The exchange-coupled structure may also be used in a "top-pinned" sensor in which the enhancement layer is located on top of the Mn-alloy antiferromagnetic layer. When the enhancement layer is on top of the Mn-alloy antiferromagnetic layer, it can be etched away to leave only the antiferromagnetic layer.

Additional elements can be added to the enhancement layer in relatively small amounts to provide additional properties without altering its chemical-ordering and thus its ability to enhance the transformation of the Mn alloy. For example, Pd can be added to relatively soft AuCu to harden it, and Fe, Pt, or Rh can be added to increase the resistivity of AuCu to make the structure more suitable for a CIP-SV sensor.

For a fuller understanding of the nature and advantages of the present invention, reference should be made to the following detailed description taken together with the accompanying figures.

DETAILED DESCRIPTION OF THE INVENTION

Figure 1:
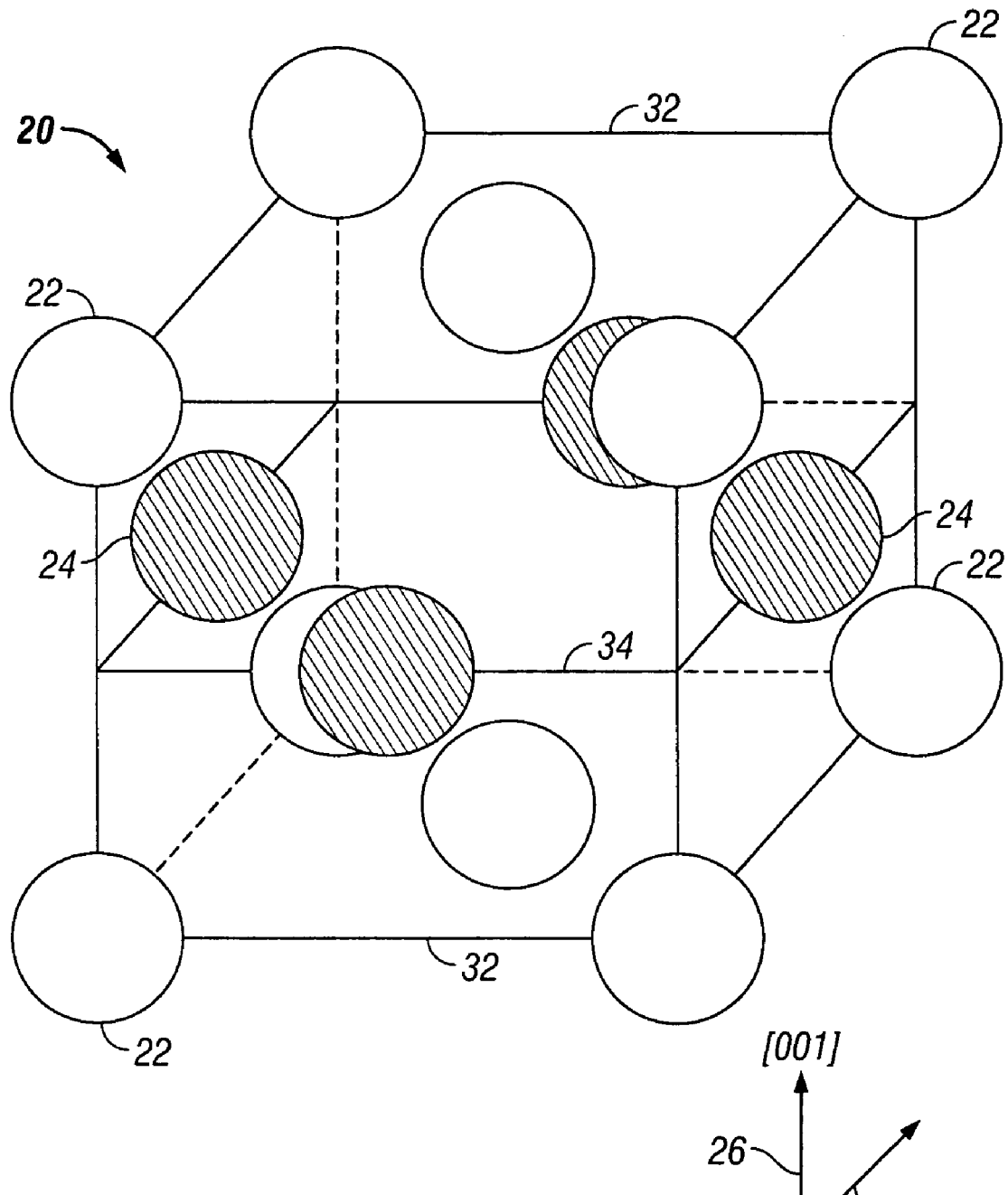
FIG. 1 is a schematic diagram of chemically-ordered PtMn showing the arrangement of atoms in the tetragonal $L1_0$ structure.
Figure 2:
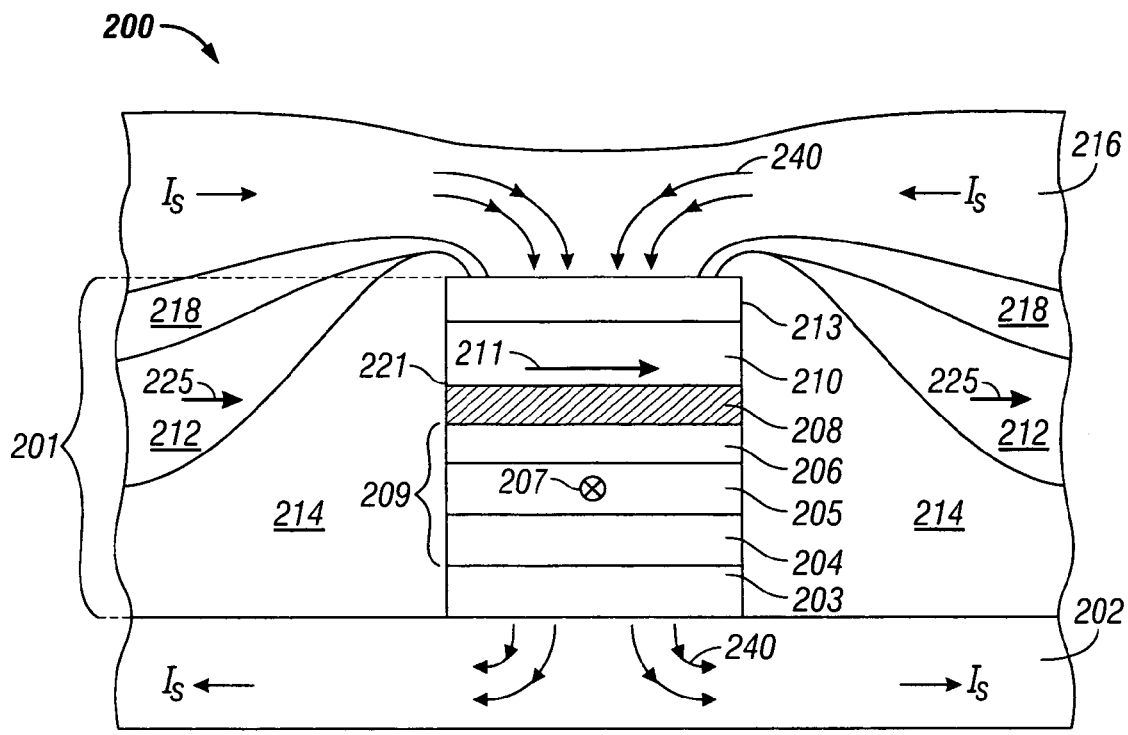
FIG. 2 is a cross-sectional view of a "bottom-pinned" CPP sensor of this invention.

FIG. 2 is a sectional view of the CPP sensor 200 according to the invention. Sensor 200 comprises a stack 201 of layers formed on a substrate 202. The sensor stack 201 is located between a bottom magnetic shield, shown as substrate 202, and a top magnetic shield 216. A bottom lead layer 203 is located adjacent substrate 202 and a top lead layer 213 is located adjacent top shield 216. Sense current Is passes through top shield 216, perpendicularly through the stack 201, and through bottom shield/substrate 202, as shown by arrows 240.

The layers in stack 201 also include a pinned ferromagnetic layer 206 having a fixed magnetic moment or magnetization direction 207 oriented transversely (out of the page), a free ferromagnetic layer 210 having a magnetic moment or magnetization direction 211 that can rotate in the plane of layer 210 in response to transverse external magnetic fields, and a nonmagnetic spacer layer 208 between the pinned layer 206 and free layer 210. The pinned layer 206 is exchange-coupled with an antiferromagnetic layer 205 that is formed on underlayer 204. The underlayer 204, antiferromagnetic layer 205 and pinned ferromagnetic layer 206 together form the exchange-coupled structure 209. As a result of the exchange-coupling with the antiferromagnetic layer 205, the pinned ferromagnetic layer 206 exhibits an exchange-bias field so that its magnetization direction 207 will not rotate in the presence of an external magnetic field in the range of interest, i.e., magnetic fields from recorded data.

The pinned layer 206 and free layer 210 are typically formed of an alloy of one or more of Co, Fe and Ni, or a bilayer of two alloys, such as a CoFe—NiFe bilayer. The antiferromagnetic layer 205 is typically one of the chemically-ordered Mn alloys PtMn, NiMn, IrMn, PdMn or RhMn. These antiferromagnetic Mn alloys may also include small amounts of additional elements, such as Cr, V, Pt, Pd and Ni, that are typically added to improve corrosion resistance or increase electrical resistance. For a CPP-SV sensor, the spacer layer 208 is electrically conductive, and is typically formed of copper. For a MTJ sensor, the spacer layer 208 is an electrically insulating tunnel barrier layer, and is typically alumina ($Al_2O_3$). Lead layers 203, 213 may be formed of Ru, Ta or a bilayer of Ru/Cu or Ta/Cu, or other well-known electrically conductive lead materials. The magnetic shields 202, 216 are typically formed of permalloy (NiFe) or sendust (FeAlSi).

The sensor 200 also includes longitudinal biasing layers 212 outside the sensor stack near the side edges of free layer 210. The biasing layers 212 may be formed of hard ferromagnetic material, such as CoPt or CoCrPt, and are electrically insulated from the sensor stack 201 and the shields 202, 216 by insulating layers 214 and 218, respectively. The biasing layers 212 provide a longitudinal biasing magnetic field, as shown by arrows 225, to stabilize the magnetization of the free layer 210 longitudinally in the direction 211 along the length of the free layer.

While the structure shown in FIG. 2 has the pinned ferromagnetic layer 206 below the free layer 210, these layers could be reversed, in which case the exchange-coupled structure 209 would be located above the spacer layer 208 with the order of the layers in structure 209 also being reversed, i.e., pinned layer 206 would be located on spacer layer 208, antiferromagnetic layer 205 would be on top of pinned layer 206 and underlayer 204 would be on top of antiferromagnetic layer 205.

Also, the pinned layer 206 can be the well-known antiparallel-pinned (AP-pinned) structure, also called a "laminated" pinned layer, as described in U.S. Pat. No. 5,465,185. The AP-pinned structure comprises a ferromagnetic pinned film that would be in contact with the antiferromagnetic layer 205, a non-magnetic spacer film and a ferromagnetic reference film. This structure minimizes magnetostatic coupling of the pinned layer 206 with the free layer 210.

As described thus far, the sensor is like a prior art CPP magnetoresistive sensor. However, in the CPP sensor of this invention the exchange-coupled structure 209 enables a substantially thinner Mn-alloy antiferromagnetic layer 205 as a result of the underlayer 204. Underlayer 204 enhances the formation of the Mn-alloy antiferromagnetic layer. The underlayer 204 is a substantially-chemically-ordered alloy having a tetragonal crystalline structure, the alloy being selected from the group consisting of alloys of AuCu, FePt, FePd, AgTi3, Pt Zn, PdZn, IrV, CoPt and PdCd.

In the preferred embodiment the antiferromagnetic layer is chemically-ordered equiatomic $Pt_{50}Mn_{50}$ located on and in direct contact with an underlayer of chemically-ordered equiatomic $AU_{50}Cu_{50}$. The two layers are deposited by magnetron or ion-beam sputtering. After all the layers in the sensor are deposited the sensor is subjected to annealing for 4 hours at 250° C. As a result of thermally-activated atomic diffusion, the AuCu underlayer transforms to the $L1_0$ phase and helps the PtMn with which it is in contact to also transform to the $L1_0$ phase. When formed on a AuCu underlayer having a thickness between approximately 10 and 200 Å, the PtMn layer can be as thin as 50 Å, preferably in the range of 25 to 50 Å, and still transform to the $L1_0$ phase and thus generate the required exchange-bias in the antiferromagnetic layer. When the PtMn is formed on a conventional underlayer, such as Ta or NiFeCr, it is required to be approximately 150 Å thick. Thus a PtMn layer thickness of less than approximately 125 Å is a significant improvement. Because AuCu has a significantly lower electrically resistivity than PtMn, and because the PtMn can be made thinner, the electrical resistance of the PtMn/AuCu can be reduced by 30% or more over the conventional PtMn/underlayer. This reduction in resistance increases the magnetoresistance of the sensor for a given sense current, or allows the sensor to be designed with a lower sense current.

The exchange-coupled structure 209 also has advantages when used in a CIP-SV magnetoresistive sensor. A CIP-SV sensor is similar to CPP sensor shown in FIG. 2 with the primary difference being that the sense current is in the plane of the layers in the stack 201. The biasing layers 212 do not need to be insulated from the stack 201, but electrically insulating material, typically alumina, is located between the stack 201 and the shields 202, 216. Because the electrical resistance of the antiferromagnetic layer 206, typically PtMn, is not a factor in a CIP-SV sensor, the thickness of the PtMn is less of a concern than in CPP sensors. However, as magnetic recording densities increase, the overall thickness of the sensor has to be reduced. This makes reducing the PtMn thickness also advantageous in CIP-SV sensors. For example, a sensor having a combined PtMn layer/underlayer thickness less than approximately 150 Å would be a significant improvement. Because the AuCu underlayer encourages the transformation of the PtMn to the $L1_0$ phase during annealing, a much lower anneal temperature and/or anneal time is required, thereby improving the fabrication process. In a CIP-SV sensor, shunting of current from the additional AuCu or other layer would lead to reduced magnetoresistance. To reduce or prevent this effect an alloy with a higher resistivity, such as FePt or AgTi3, or ternary alloys of Ag, Ti, Pd, V, could be used.

While AuCu is the preferred underlayer material, other materials that can be expected to provide similar enhancement of the transformation of the Mn-alloy to the $L1_0$ phase are FePt, FePd, AgTi3, Pt Zn, PdZn, IrV, CoPt and PdCd because each of these materials is also in the $L1_0$ or related structure with a very close lattice parameters to PtMn.

The grain size of AuCu is about 90 Å in the plane while the grain size of PtMn is about 120 Å. Thus it is believed that the enhancing properties of the AuCu underlayer can be improved by depositing the AuCu on a seed layer of Ru or Rh. Ruthenium and rhodium have hexagonal-close (hcp) cell lattices relatively close to the hcp surface equivalent lattice for as-deposited fcc AuCu, and thus should promote the appropriate texture and larger grain size in the AuCu.

In the preferred embodiment of the chemically-ordered film, the Pt and Mn in the PtMn antiferromagnetic layer, and the Au and Cu in the enhancing underlayer, are present in "generally equiatomic" amounts, i.e., when the atomic percentage of either the first or second element is present in a two-element film in the range of approximately 35-65 atomic percent. The existence range in compositions of intermetallic compounds (ordered intermetallic phases like PtMn, AuCu etc.) is generally fairly broad, approximately +/−15%. This has to do with the weak nature of the metallic bond, as compared with the ionic bond in semiconductors where typically only very narrow "line" compounds can be formed. The weak metallic bond allows for segregation and diffusion.

Additional elements can be added to the underlayer in relatively small amounts, typically less than 10 atomic percent, to provide additional properties without altering its chemical-ordering and thus its ability to enhance the transformation of the Mn-alloy to the $L1_0$ phase. For example, because undesirable smearing of soft layers can occur during mechanical lapping of the head carrier or slider on which the sensor is fabricated, and AuCu is a soft alloy, Pd can be added in an amount less than approximately 10 atomic percent to harden the AuCu alloy. Also, Fe, Pt, or Rh will increase the resistivity of the AuCu layer, making it more suitable for CIP-SV applications.

Figure 3:
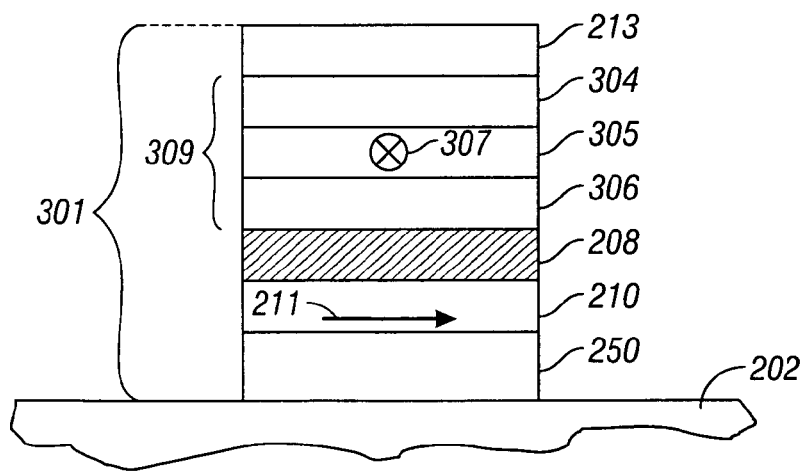
FIG. 3 is a cross-sectional view of a sensor stack for a "top-pinned" sensor of this invention.

As described above and shown in FIG. 2, the exchange-coupled structure 209 is located below the spacer layer 208 in a "bottom-pinned" sensor. The underlayer 204 acts as an enhancement layer that assists the transformation of the Mn-alloy antiferromagnetic layer to the $L1_0$ phase as a result of thermally-activated atomic diffusion during annealing. However, the exchange-coupled structure may also be used in a "top-pinned" sensor in which the enhancement layer (underlayer 204) is not an "underlayer" but is located on top of the Mn-alloy antiferromagnetic layer. FIG. 3 shows a sensor stack 301 with this embodiment. In this structure the free layer 210 with magnetization direction 211 is formed on a suitable seed layer 250 on substrate 202. The spacer layer 208 is on the free layer 210 and the pinned layer 306 is on the spacer layer 208. The exchange-coupled structure 309 comprises the pinned layer 306, the Mn-alloy antiferromagnetic layer 305 with magnetization direction 307, and the substantially-chemically-ordered tetragonal crystalline structure enhancement layer 304.

When the enhancement layer 304 is on top of the Mn-alloy antiferromagnetic layer, it can be etched away to leave only the antiferromagnetic layer 305. Thus in the top-pinned sensor of FIG. 3, after annealing the enhancement layer 304 has facilitated the phase transformation of the underlying antiferromagnetic layer 305 and is no longer necessary, so the enhancement layer 304 can be removed prior to deposition of the lead layer 213. The resulting exchange-coupled structure 309 would then be just the pinned layer 306 and the Mn-alloy antiferromagnetic layer 305. Similarly, in the bottom-pinned sensor of FIG. 2, if the layer 204 is an enhancement layer located on top of antiferromagnetic layer 205 instead of an underlayer, it can be etched away prior to deposition of the pinned layer 206, so that the exchange-coupled structure 209 would be just the Mn-alloy antiferromagnetic layer 205 and the pinned layer 206.

The result of locating the enhancement layer on top of the antiferromagnetic layer is that the Mn-alloy antiferromagnetic layer can be made substantially thinner. When a AuCu underlayer having a thickness between approximately 10 and 200 Å is used as an underlayer, the PtMn layer can be as thin as 50 Å, preferably in the range of 25 to 50 Å, and still transform to the $L1_0$ phase and thus generate the required exchange-bias in the antiferromagnetic layer. If the AuCu layer of this same thickness is on top of the PtMn and then removed, the overall thickness is reduced to just the thickness of the PtMn layer. This results in a significant reduction in resistance, which increases the magnetoresistance of the sensor for a given sense current, or allows the sensor to be designed with a lower sense current.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. An antiferromagnetically exchange-coupled structure in a magnetic device of the type having a substrate and a plurality of ferromagnetic layers, the structure being formed on the substrate and comprising:
   a first layer formed of a substantially-chemically-ordered alloy having a tetragonal crystalline structure, the alloy selected from the group consisting of alloys of AuCu, FePt, FePd, AgTi3, Pt Zn, PdZn, IrV, CoPt and PdCd;
   an antiferromagnetic layer in contact with the first layer and formed of a substantially-chemically-ordered alloy comprising X and Mn and having a tetragonal crystalline structure, wherein X is selected from the group consisting of Pt, Ni, Ir, Pd and Rh; and
   a ferromagnetic layer exchange-coupled with the antiferromagnetic layer.

2. The structure of claim 1 wherein the ferromagnetic layer is located between the substrate and the antiferromagnetic layer.

3. The structure of claim 1 wherein the antiferromagnetic alloy further comprises one or more of Cr, Pt, Pd, V and Ni.

4. The structure of claim 1 wherein the first element listed in each first layer alloy in the group is present in the alloy in amount between approximately 35 and 65 atomic percent.

5. The structure of claim 1 wherein the first layer alloy comprises Au and Cu and the antiferromagnetic alloy comprises Pt and Mn.

6. The structure of claim 5 wherein the thickness of the PtMn alloy antiferromagnetic layer is less than approximately 125 Angstroms.

7. The structure of claim 6 wherein the thickness of the AuCu first layer is between approximately 10 and 200 Angstroms.

8. A magnetoresistive read head for sensing data recorded on a magnetic recording medium in the presence of sense current through the head, the head comprising:
   a substrate;
   a free ferromagnetic layer having a magnetization direction oriented substantially parallel to the plane of the recording medium in the absence of an external magnetic field, said free layer magnetization direction being substantially free to rotate in the presence of magnetic fields from the recording medium;
   a nonmagnetic spacer layer on the free ferromagnetic layer; and
   an exchange-coupled structure comprising (a) a pinned ferromagnetic layer on the spacer layer and having a magnetization direction oriented substantially perpendicular to the plane of the recording medium and substantially prevented from rotating in the presence of magnetic fields from the recording medium; (b) an antiferromagnetic layer exchange-coupled with the pinned ferromagnetic layer and formed of a substantially-chemically-ordered alloy comprising X and Mn and having a tetragonal crystalline structure, wherein X is selected from the group consisting of Pt, Ni, Ir, Pd and Rh; and (c) a chemically-ordering enhancement layer in contact with the antiferromagnetic layer and formed of a substantially-chemically-ordered alloy having a tetragonal crystalline structure, the enhancement layer alloy selected from the group consisting of alloys of AuCu, FePt, FePd, AgTi3, PtZn, PdZn, IrV, CoPt and PdCd.

9. The head according to claim 8 wherein the head is a current-in-the-plane head having the sense current directed substantially parallel to the plane of the free layer.

10. The head according to claim 8 wherein the head is a current-perpendicular-to-the-plane head having the sense current directed substantially perpendicular to the plane of the free layer.

11. The head according to claim 9 wherein the head is a spin-valve head and wherein the nonmagnetic spacer layer is electrically conducting.

12. The head according to claim 9 wherein the head is a magnetic tunnel junction head and wherein the nonmagnetic spacer layer is an electrically-insulating tunnel barrier.

13. The head of claim 8 wherein the antiferromagnetic alloy further comprises one or more of Cr, Pt, Pd, V, and Ni.

14. The head of claim 8 wherein the first element listed in each enhancement layer alloy in the group is present in the alloy in amount between approximately 35 and 65 atomic percent.

15. The head of claim 8 wherein the enhancement layer alloy comprises Au and Cu and the antiferromagnetic alloy comprises Pt and Mn.

16. The head of claim 15 wherein the thickness of the PtMn alloy antiferromagnetic layer is less than approximately 125 Angstroms.

17. The head of claim 16 wherein the thickness of the AuCu underlayer is between approximately 10 and 200 Angstroms.

18. A current-perpendicular-to-the-plane (CPP) magnetoresistive read head for sensing data recorded on a magnetic recording medium in the presence of sense current directed substantially perpendicular to the planes of the layers making up the head, the head comprising:
   a substrate;
   a free ferromagnetic layer on the substrate and having a magnetization direction oriented substantially parallel to the plane of the recording medium in the absence of an external magnetic field, said free layer magnetization direction being substantially free to rotate in the presence of magnetic fields from the recording medium;
   an exchange-coupled structure on the substrate and comprising (a) a pinned ferromagnetic layer having a magnetization direction oriented substantially perpendicular to the plane of the recording medium and substantially prevented from rotating in the presence of magnetic fields from the recording medium, and (b) an antiferromagnetic layer exchange-coupled with the pinned ferromagnetic layer and formed of a substantially-chemically-ordered alloy comprising Pt and Mn and having a tetragonal crystalline structure, the thickness of the PtMn alloy antiferromagnetic layer being less than approximately 125 Angstroms; and
   a nonmagnetic spacer layer between the free ferromagnetic layer and the pinned ferromagnetic layer.

19. The head according to claim 18 wherein the free layer is located between the substrate and the exchange-coupled structure.

20. The head of claim 18 wherein the antiferromagnetic alloy further comprises one or more of Cr, Pt, Pd, V, and Ni.

* * * * *